(12) United States Patent
Major

(10) Patent No.: US 7,378,878 B2
(45) Date of Patent: May 27, 2008

(54) DRIVER CIRCUIT HAVING PROGRAMMABLE SLEW RATE

(75) Inventor: Donald E. Major, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 56 days.

(21) Appl. No.: 11/115,201

(22) Filed: Apr. 27, 2005

(65) Prior Publication Data

US 2006/0244479 A1 Nov. 2, 2006

(51) Int. Cl.
*H03K 19/0175* (2006.01)
(52) U.S. Cl. .................... 326/87; 326/26; 326/27; 327/170; 327/108
(58) Field of Classification Search ............ 326/81, 326/27, 26; 327/170
See application file for complete search history.

(56) References Cited

U.S. PATENT DOCUMENTS

| | | | |
|---|---|---|---|
| 5,568,081 A * | 10/1996 | Lui et al. ............... | 327/380 |
| 6,304,120 B1 * | 10/2001 | Taito ...................... | 327/170 |
| 6,359,484 B1 * | 3/2002 | Ajit ........................ | 327/170 |
| 6,441,653 B1 * | 8/2002 | Spurlin .................. | 327/108 |
| 6,559,676 B1 * | 5/2003 | Tomita ................... | 326/81 |
| 6,768,363 B2 * | 7/2004 | Yoo et al. .............. | 327/170 |

* cited by examiner

*Primary Examiner*—Vibol Tan
(74) *Attorney, Agent, or Firm*—Sterne Kessler Golstein & Fox, p.l.l.c.

(57) ABSTRACT

The programmable slew rate driver uses separate and programmably selectable resistors for time constants for on and off transitions on the NMOS and PMOS output transistors. By proper setting of gate voltage time constants and overlap of NMOS and PMOS "on" times, a desired output slew rate is accomplished, having a smooth output transition, without generation of shoot-through current. The programmable slew rate driver includes a first driver transistor coupled between the first supply voltage and output, a second driver transistor coupled between the second supply voltage and output, a plurality of upper transition blocks coupled in parallel and a plurality of lower transition blocks coupled in parallel between the first and second supply voltage. The rates of change and overlap of the gate voltages are in turn substantially determined by the resistance of the lower transition control blocks and the capacitance of the gate of the second driver transistor.

20 Claims, 7 Drawing Sheets

US 7,378,878 B2

DRIVER CIRCUIT HAVING PROGRAMMABLE SLEW RATE

FIELD OF THE INVENTION

The application relates generally to integrated circuits and specifically to driver circuits having programmable slew rates.

BACKGROUND OF THE INVENTION

Driver circuits are critical components in a large number of applications, particularly memory applications. In general, a driver circuit has an output which is driven to a first voltage level to represent a data bit "1" and a second voltage level to represent a data bit "0." The rate of change of the output signal voltage between data "0" and data "1" and data "1" and data "0" as a function of time is referred to as the "slew rate."

Conventional driver circuits include a PMOS transistor coupled in series to an NMOS transistor. Typically, the gates of both transistors are tied together so that both transistors receive the same input signal. These driver circuits are designed such that the PMOS and NMOS transistors operate in a complementary fashion. That is, when the PMOS transistor is on, coupling a first supply voltage to the output, the NMOS transistor is off and when the NMOS transistor is on, coupling a second supply voltage to the output, the PMOS transistor is off. In some applications, both transistors may be off.

Many conventional driver circuits use high output swing CMOS transistors. However, these transistors are difficult to turn on and off in an optimal fashion. Thus, these conventional driver circuits are susceptible to a variety of phenomena which impact the quality of the output signal. For example, if the transition of the output signal from low to high and vice versa is too rapid, chip and board power distribution and signal interconnection are stressed, resulting in excessive ground bounce, cross talk, and signal ringing. If the transitions are too slow, timing errors in devices or circuits using the driver circuit output could occur.

In addition, if both transistors in the driver circuit are on simultaneously (e.g., when one or both transistors do not turn off rapidly enough), shoot-through currents occur. When both transistors are on, a substantial portion of the current sourced by the PMOS transistor flows through the NMOS transistor to the second supply voltage which is typically ground or a negative supply voltage. A shoot-through current causes wasted power, and drooping and ringing in the supply voltage.

The quality of the output signal is also impacted if both transistors are off at the same time. If both transistors are off simultaneously, flat spots occur in the output transitions. These flat spots may cause timing errors in devices and circuits coupled to the output of the driver circuit.

Many conventional driver circuits also include one or more predriver circuits designed to control the on and off transitions of the driver transistors. These predrivers are typically also CMOS field-effect transistors, like the driver transistors. Because the threshold voltage of the predriver transistors causes non-uniform time constant behavior over the switching range of the driver transistors, the predriver transistors have difficulty maintaining their characteristics over the full switching range of the driver transistors. Thus, the characteristics of the predriver transistors are dependent on supply voltage and process variations.

The maximum data rate supported by a driver circuit is important factor in its usability in certain applications. The maximum data rate of a driver circuit may be limited by the settling time of the circuit. Under certain conditions, the output signal may initially rise above the desired voltage value for a data "1" and then settle to the desired voltage value. The time required to reach the desired voltage is referred to as the settling time. If the settling of the gate control voltage, and therefore the output signal, is incomplete at the maximum data rate, then the driver delay and/or output voltage shape may vary with the data pattern, leading to an undesirable source of system timing errors.

Therefore, a need exists for a driver circuit having programmable gate control voltage time constants, with voltage clamping on the output transistor gates to allow for moderate slew rates, tight duty cycle control, and fast data rates.

A further need exists for a programmable slew rate control system having driver transistors which are turned on and off relative to each other with enough overlap for a smooth transition but not enough overlap to cause significant shoot-through current.

A need also exists for a programmable slew rate having a predriver circuit allowing for fine control of the on and off times of the driver transistors.

BRIEF SUMMARY OF THE INVENTION

The present invention is directed to a programmable slew rate driver circuit. In accordance with an aspect of the present invention, the programmable slew rate driver circuit includes a first driver transistor coupled between the first supply voltage and a first node and a second driver transistor coupled between the second supply voltage and the first node. The programmable slew rate driver circuit further includes a plurality of upper transition blocks coupled in parallel between the first supply voltage and the second supply voltage and a plurality of lower transition blocks coupled in parallel between the first supply voltage and the second supply voltage.

Each upper transition control block includes a first switch coupled to the first supply voltage and a first resistance coupled to the first switch and the gate of the first driver transistor. Each upper transition control block further includes a second resistance coupled to the gate of the first driver transistor and a second switch coupled between the second resistance and the second supply voltage.

Each lower transition control block includes a third switch coupled to the first supply voltage and a third resistance coupled to the third switch and the gate of the second driver transistor. Each upper transition control block further includes a fourth resistance coupled to the gate of the second driver transistor and a fourth switch coupled between the second resistance and the second supply voltage.

The resistance of the plurality of upper transition control blocks is determined by applying a control signal to set the position of the first switch and second switch in each upper transition control block. The resistance of the plurality of lower transition control blocks is determined by applying a control signal to set the position of the third switch and fourth switch in each lower transition control block. In an embodiment, the control signal for setting the first and second switches is the same as the control signal for setting the third and fourth switches.

The speed of the transition of the output signal of the circuit from a first voltage to a second voltage is substantially determined by the resistance of the upper transition control blocks and the gate capacitance of the first driver transistor. The speed of the transition of the output signal of the circuit from the second voltage to the first voltage is substantially determined by the resistance of the lower transition control blocks and the gate capacitance of the second driver transistor.

In accordance with a further aspect of the present invention, the slew rate control circuit includes a first voltage clamp coupled between the first supply voltage and the gate of the first driver transistor and a second voltage clamp coupled between the second supply voltage and the gate of the second driver transistor. The first and second voltage clamps are configured to limit the value of the second output voltage.

In accordance with an aspect of the present invention, the slew rate control circuit also includes a programmable resistance block coupled to the drain of the first driver transistor and the drain of the second driver transistor. The programmable resistance block includes a plurality of resistance stages coupled in parallel between the first node and an output node of the circuit. Each resistance stage includes a switch coupled in series to a resistance. The resistance of the output block is determined by applying a plurality of control signals to the plurality of resistance stages to set the position of the switch in each resistance stage.

It is to be understood that both the foregoing general description and the following detailed description are exemplary and explanatory, and are intended to provide further explanation of the invention as claimed.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
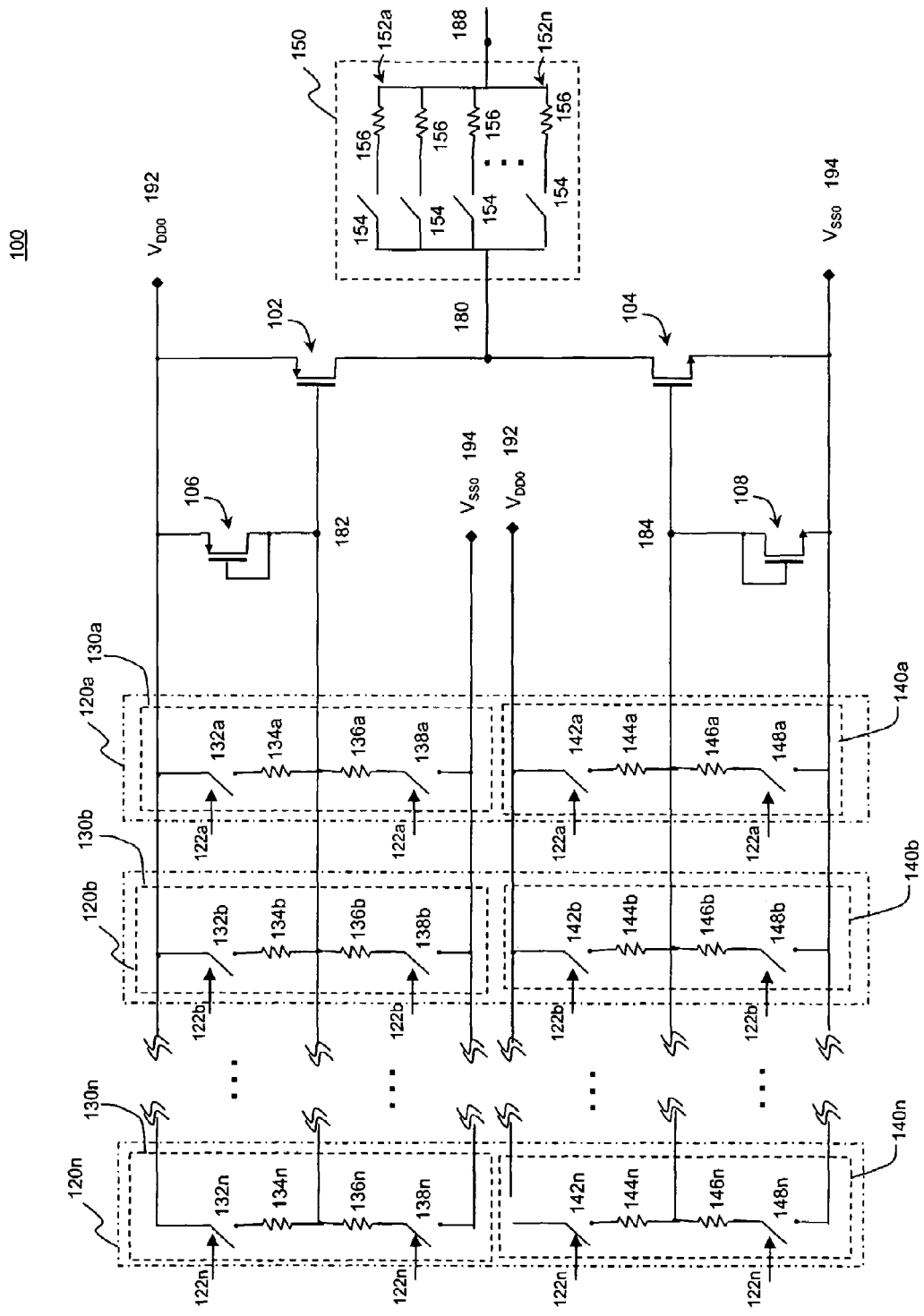
FIG. 1 is a block diagram of a programmable slew rate control system, according to an embodiment of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

FIG. 1 is a block diagram of a programmable slew rate control system 100, according to an embodiment of the present invention. The programmable slew rate control system 100 includes a pair of driver transistors 102, 104 designed to operate in a complementary manner, a voltage clamp 106, a voltage clamp 108, and one or more transition control blocks 120.

Driver transistor 102 is coupled between first supply voltage 192 (e.g., $V_{DD0}$) and node 180 and driver transistor 104 is coupled between node 180 and second supply voltage 194 (e.g., $V_{SS0}$). Driver transistor 102 and driver transistor 104 are turned on and off relative to each other with enough overlap for a smooth transition of the output signal at node 180 but not enough overlap to result in a significant shoot-through current. In an embodiment, driver transistor 102 is a PMOS transistor and driver transistor 104 is an NMOS transistor. In this embodiment, the source of driver transistor 102 is coupled to first supply voltage 192 and the drain of driver transistor 102 is coupled to node 180. The source of driver transistor 104 is coupled to second supply voltage 194 and the drain of driver transistor 104 is coupled to node 180.

Voltage clamp 106 is coupled between first supply voltage 192 and the gate of driver transistor 102. Voltage clamp 108 is coupled between second supply voltage 194 and the gate of driver transistor 104. In an embodiment, voltage clamp 106 is a PMOS transistor having its gate coupled to its drain and its source coupled to first supply voltage 192. Voltage clamp 108 is an NMOS transistor having its gate coupled to its drain and its source coupled to second supply voltage 194. Although voltage clamps 106, 108 are illustrated as transistors, persons of skill in the art would appreciate that any type of voltage clamp could be used with the present invention.

Voltage clamps 106, 108 limit the gate voltages of driver transistors 102, 104, respectively. In general, the clamped voltage must be high enough to turn the driver transistors on sufficiently but preferably not so high that too much time is wasted from allowing gate voltage excursions far beyond the region where the most switching action occurs. For example, in an embodiment, the output signal at node 180 (i.e., the output of driver transistors 102 and 104) transitions between a low output voltage (approximately the second supply voltage) and a high output voltage (approximately the first supply voltage minus the clamped voltage). Without the voltage clamps, the output signal at node 180 would transition between the first supply voltage and approximately the second supply voltage. Thus, with the voltage clamps, the transition range of the output signal is smaller, allowing time for slower control voltage transition rates. If a similar transition speed was used in a circuit without voltage clamps, a significant portion of the cycle time would be used for the slow ramp over the large voltage range (i.e., from the first supply voltage to the second supply voltage). As a result, sufficient settling time would not be available for the driver circuit in the short remaining cycle time. Thus, using a slow gate transition rate without clamping (limiting) the voltage, while advantageous in reducing the output slew rate, could sometimes result in data-pattern-dependent variations in the switching characteristics and output voltages.

Slew rate control system 100 also includes one or more transition control blocks 120a-n. Each transition control block 120 includes an upper portion 130 and a lower portion 140. In an embodiment, a transition control block 120 may have only an upper portion 130 or only a lower portion 140. Upper portion 130 includes first switch 132, first resistor 134, a second resistor 136, and second switch 138 coupled in series between first supply voltage 192 and second supply voltage 194. First switch 132 is coupled between first supply voltage 192 and first resistor 134. First resistor 134 is coupled between first switch 132 and the gate of driver transistor 102. Second resistor 136 is coupled between the gate of driver transistor 102 and second switch 138. Second switch 138 is coupled between second resistor 136 and second supply voltage 194.

Lower portion 140 includes third switch 142, third resistor 144, a fourth resistor 146, and fourth switch 148 coupled in series between first supply voltage 192 and second supply voltage 194. Third switch 142 is coupled between first supply voltage 192 and third resistor 144. Third resistor 144 is coupled between third switch 142 and the gate of driver transistor 104. Fourth resistor 146 is coupled between the gate of driver transistor 104 and fourth switch 148. Fourth switch 148 is coupled between fourth resistor 146 and second supply voltage 194.

Although, upper portion 130 and lower portion 140 have similar configurations, in an embodiment, the components in upper portion 130 and lower portion 140 differ in size. For example, in this embodiment, the components of upper portion 130, which is coupled to the PMOS driver transistor, are generally larger than the components in lower portion 140, which is coupled to the NMOS driver transistor. This size discrepancy is due, in part, to the fact that PMOS and NMOS transistors have different mobilities in their respective majority carriers.

In an embodiment, switches 132, 138, 142, and 148 receive a control signal 122. Control signal 122 determines whether the switch is in an open or closed state. In an alternate embodiment, each switch receives a separate control signal. By selectively opening or closing switches in one or more transition control blocks, lower or higher resistances are coupled to driver transistors 102, 104. This in turn allows the slew rate of the output signal at node 180 to be programmable over a supported range. Using resistors to control the gate voltages of the output driver transistors 102 and 104 independently ensures a suitable gate discharge rate that results in the desired degree of driver output transistor "on" overlap during the data transition. This allows a smooth output voltage transition, at the desired slew rate, while avoiding either shoot-through current or dead times in the output voltage transition at nodes 180 and 188.

In an embodiment, switches 132 and 142 are PMOS transistors and switches 138 and 148 are NMOS transistors. When a single control signal 122 is applied to all switches, switches 132, 142 and switches 138, 148 operate in a complementary manner. That is, when switches 132 and 142 are closed, switches 138 and 148 are opened, and vice versa.

Slew rate control system 100 further includes an optional output impedance circuit 150. In an embodiment, output impedance circuit 150 includes a fixed resistance coupled between node 180 and output node 188. In an alternate embodiment, depicted in FIG. 1, output impedance circuit 150 is programmable. In this embodiment, impedance circuit 150 includes a plurality of impedance branches 152a-n coupled in parallel between node 180 and output node 188. Each impedance branch includes a switch 154 coupled in series with a resistance 156. The impedance of output impedance circuit 150 is changed by closing one or more switches in the impedance branches. In an embodiment, switches 154 receive a control signal. The control signal determines which switches are opened and closed.

The following discussion describes an exemplary slew rate control circuit using a single slew rate control block 120. When slew rate control block 120a receives control input signal 122 causing switches 138 and 148 to close, the voltages at nodes 182 and 184 begin to fall. As the voltage at node 182 falls, clamping device 106 begins to conduct, causing the potential of node 182 to rise. The gate of driver transistor 102 then reaches a point where driver transistor 102 begins to turn "on." As the voltage at node 184 falls, the gate of driver transistor 104 reaches a point where the driver transistor 104 begins to turn "off." As driver transistor 102 turns on, the voltage at output node 180 rises (or is "pulled up").

When slew rate control block 120a receives control input signal 122a causing switches 132 and 142 to close, the voltages at nodes 182 and 184 begin to rise. As the voltage at node 182 begins to rise, clamping device 106 stops conducting and the gate of driver transistor 102 reaches a point where driver transistor 102 turns "off." As the voltage at node 184 begins to rise, clamping device 108 begins to conduct, limiting the potential of node 184. As the voltage at node 184 rises, the gate of driver transistor 104 then reaches a point where driver transistor 104 begins to turn "on." As driver transistor 104 turns on, the voltage at node 180 falls (or is "pulled down").

Figure 2:
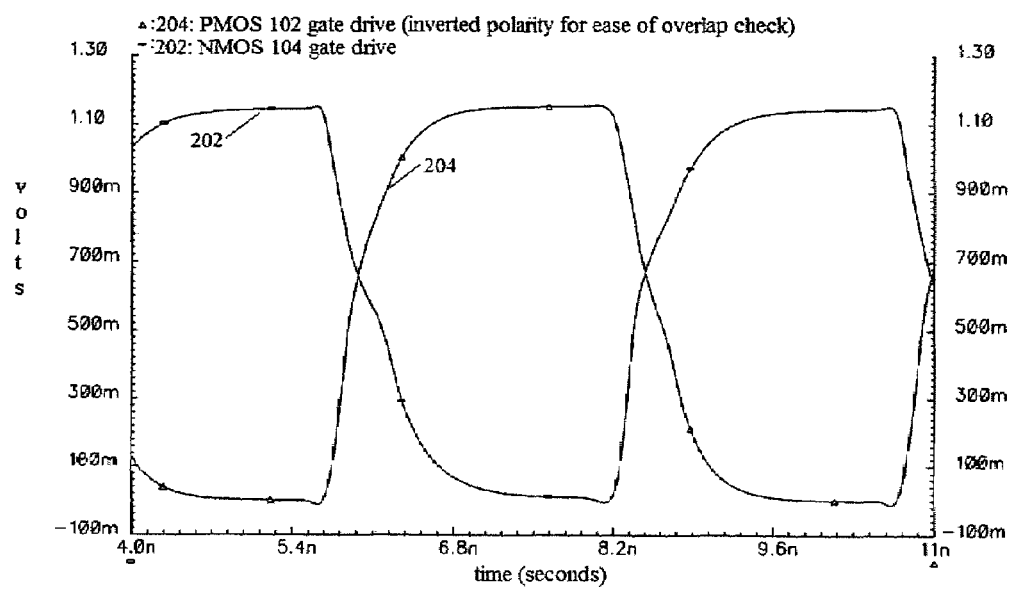
FIG. 2 depicts exemplary gate drive waveforms for the driver transistors, according to an embodiment of the present invention

FIG. 2 depicts exemplary gate drive waveforms for driver transistor 102 and driver transistor 104, according to an embodiment of the present invention. The waveforms of FIG. 2 are adjusted for PMOS and NMOS gate polarities, so that positive voltage is "on" for each device. Waveform 202 is an exemplary waveform representing the voltage at node 184 of FIG. 1. As depicted in FIG. 2, when the voltage of waveform 202 is high, driver transistor 104 is on. When the voltage of waveform 202 is low, driver transistor 104 is off. Waveform 204 is an exemplary waveform representing the voltage difference between VDD 192 and the voltage at node 182. As depicted in FIG. 2, when the voltage of waveform 204 is high, driver transistor 102 is on. When the voltage of waveform 204 is low, driver transistor 104 is off. As shown in FIG. 2, the voltage transition between on and off conditions of the PMOS and NMOS driver transistors is set to optimally control the overlap of "on" times in the NMOS and PMOS transistors. Thus, only one driver transistor is fully on at a time and only one driver transistor is fully off at a time, avoiding both shoot through currents and flat spots in the transition of the output signal.

Figure 3A:
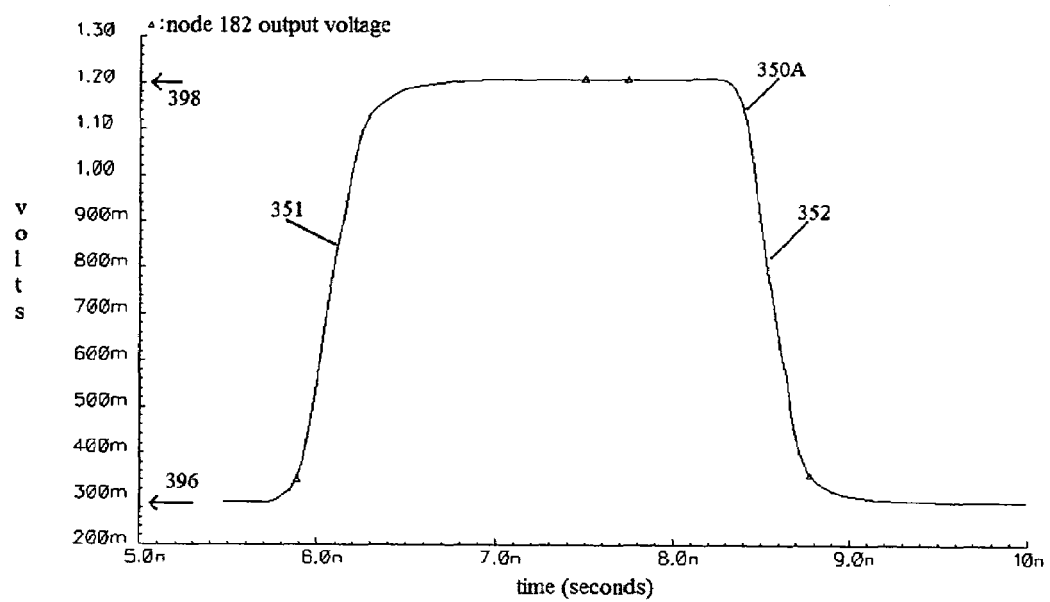
FIGS. 3A and 3B are exemplary output waveforms for the slew rate control system, according to an embodiment of the present invention.
Figure 3B:
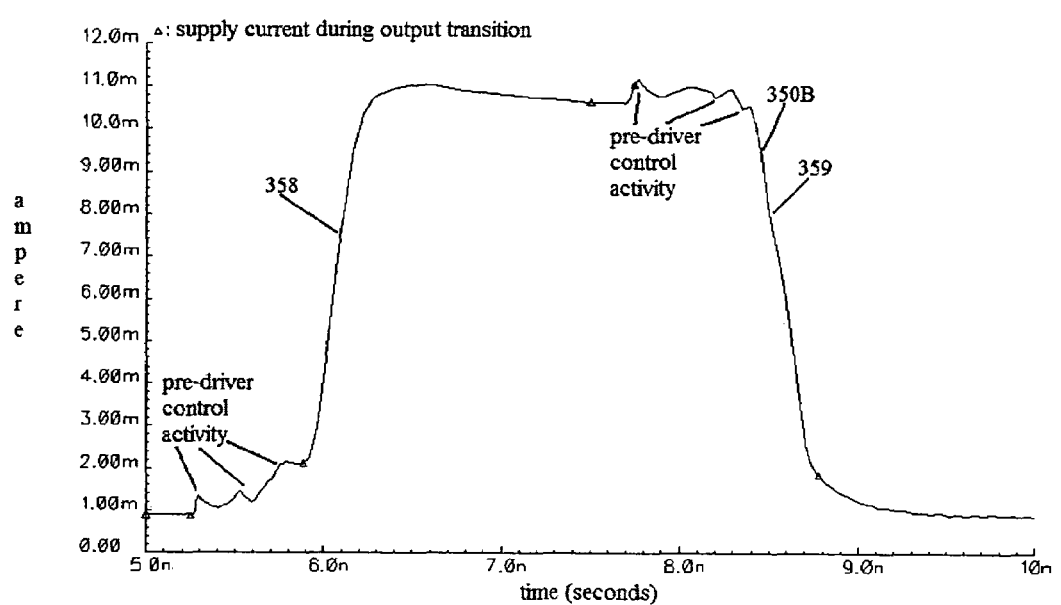

FIGS. 3A and 3B are exemplary output waveforms, taken at node 180, for slew rate control system 100, according to an embodiment of the present invention. FIG. 3A depicts output waveform 350A as a function of output voltage versus time. As shown in FIG. 3A, the transitions 351, 352 of the output signal are relatively smooth. In addition, the transition times for the transition from low 396 to high 398 and the transition from high 398 to low 396 are similar. This similarity improves signal integrity and circuit performance.

FIG. 3B depicts output waveform 350B as a function of output current versus time, according to an embodiment of the present invention. As illustrated in FIG. 3B, no significant increase in current above the output charging current occurs at transitions 358 or 359. An excess current at one or both of these transitions would be evidence of a shoot-through current between first supply voltage 192 and second supply voltage 194. In an embodiment, a moderate amount of additional current occurs at time $T_x$ due to switching the control circuit and the normal charging of transistors gates.

Figure 4A:
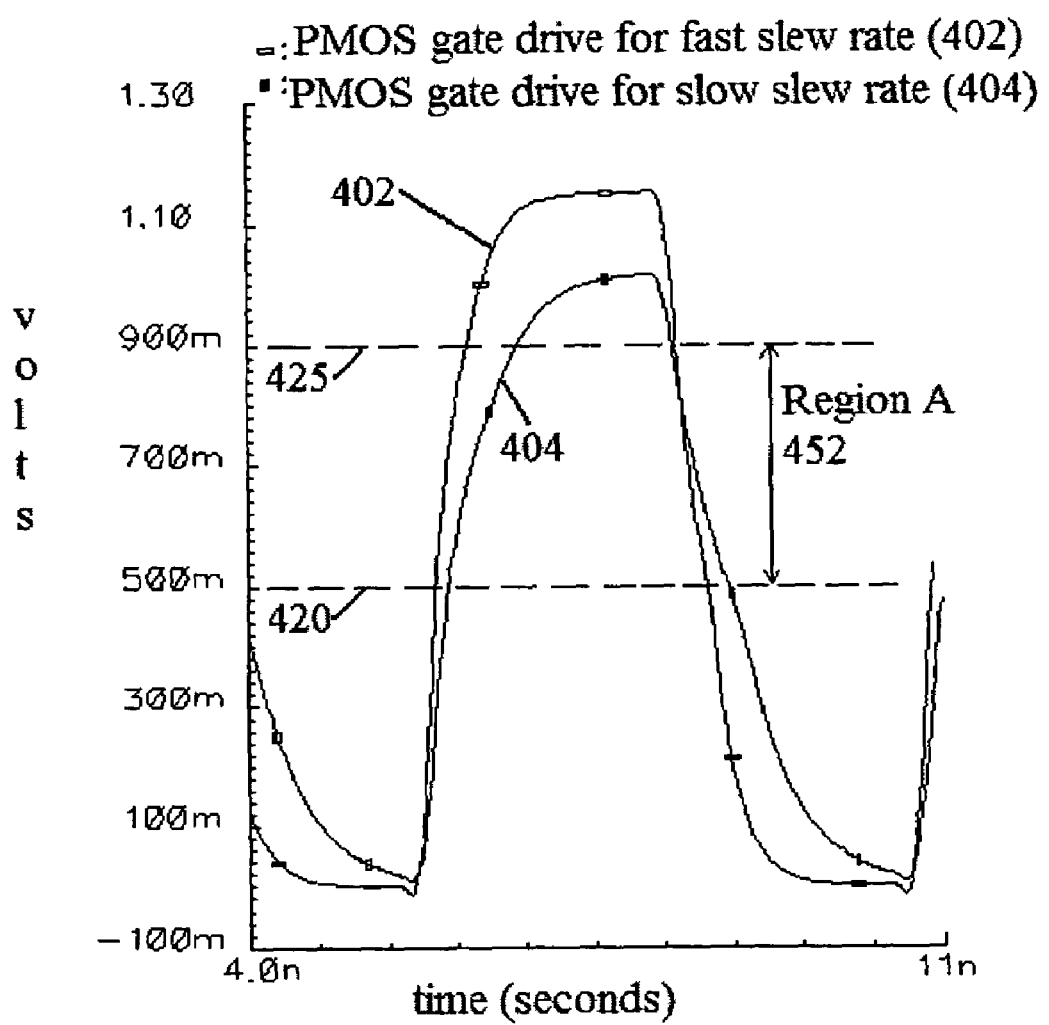
FIGS. 4A and 4B are exemplary gate drive waveforms for achieving exemplary slew rates at the output, according to an embodiment of the present invention.
Figure 4B:
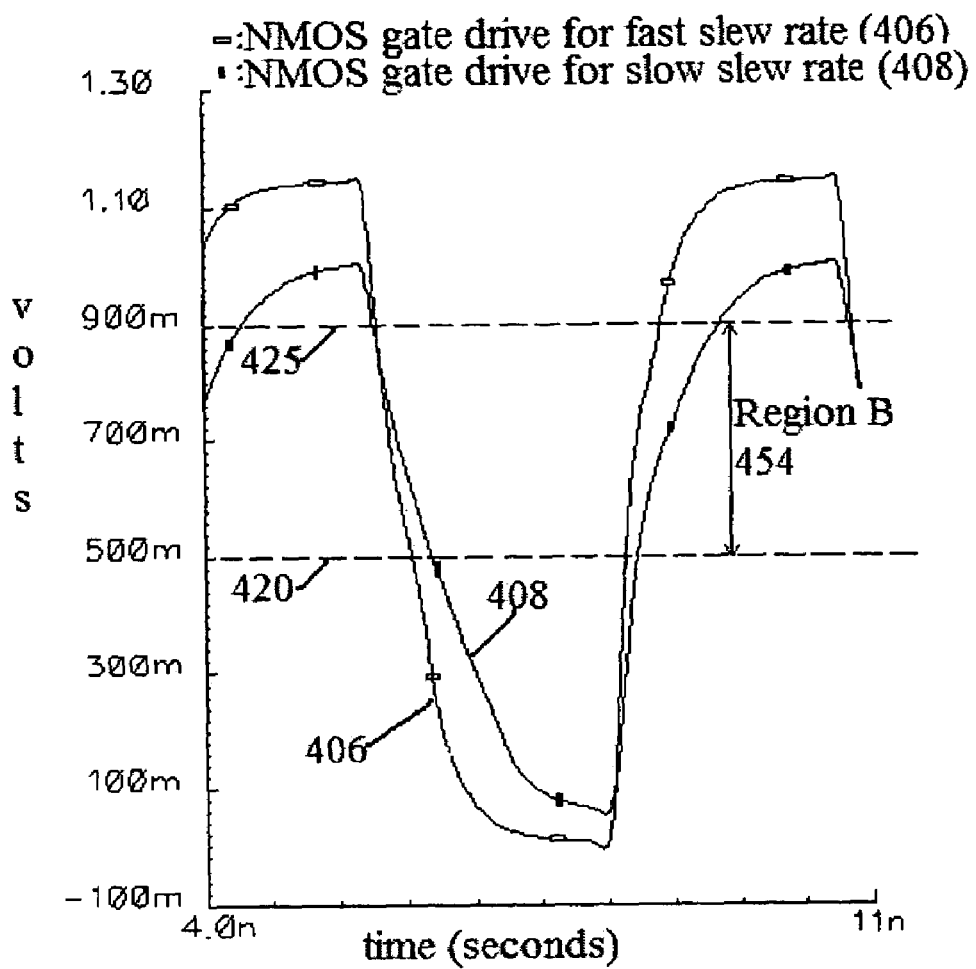

As discussed above, the slew rate of the output signal can be modified by switching in or out additional transition control blocks 120. FIGS. 4A and 4B depict exemplary gate drive waveforms for driver transistors 102 and 104, respectively, according to an embodiment of the present invention. The polarity for each waveform is adjusted so that the on direction is shown as positive for PMOS and NMOS transistors. The main parameters controlling the output transitions are the slopes and overlaps of the gate control voltages in Region A (452) for driver transistor 102 and Region B (454) for driver transistor 104. These are the regions where the transistor switching behavior are the most sensitive to changes in the gate control voltages.

In general, the slew rate control circuit determines the speed of the transition from a first output voltage (i.e., "low") to a second output voltage (i.e., "high") and the speed of transition back from the second output voltage to the first output voltage by appropriately controlling the speeds (i.e., time constants) and overlap of the two complementary gate control voltages for the NMOS and PMOS transistors. The first output voltage represents a data "0" and the second output voltage represents a data "1." The speed of the transition from first output voltage to second output voltage is determined by the time constant, $\tau_{upp}$=RC. The capacitance of the time constant is predominately the capacitance of driver transistor 102 and the resistance of the time constant is resistance due to the configuration of the upper transition control blocks. A faster gate transition time is achieved by reducing the value of time constant $\tau_{upp}$. Because the capacitance of driver transistor 102 is not alterable, the value of gate voltage time constant $\tau_{upp}$ is reduced by decreasing the value of the resistance of the upper control blocks. For example, the resistance can be decreased by switching in additional resistances in parallel. Similarly, the value of the gate voltage time constant $\tau_{upp}$ is increased by increasing the value of the resistance of the upper control blocks.

The speed of the transition from second output voltage to first output voltage is determined by the time constant, $\tau_{low}$=RC. The capacitance of the time constant is predominately the capacitance of driver transistor 104 and the resistance of the time constant is resistance due to the configuration of lower transition control blocks. A faster gate transition time is achieved by reducing the value of time constant $\tau_{low}$. Because the capacitance of driver transistor 104 is not alterable, the value of time constant $\tau_{low}$ is reduced by decreasing the value of the resistance of the lower control blocks. For example, the resistance can be decreased by switching in additional resistances in parallel. Similarly, the value of time constant $\tau_{low}$ is increased by increasing the value of the resistance of the lower control blocks.

FIGS. 4A and 4B depict exemplary voltage waveforms for output driver transistors 102 and 104, respectively, for slow and fast slew rate settings, according to an embodiment of the present invention. As discussed above, the slew rate is controlled by the configuration of the upper and lower transition control blocks 120. In the embodiment depicted in FIGS. 4A and 4B, driver transistor 102 is a PMOS transistor and driver transistor 104 is an NMOS transistor. Furthermore, in FIGS. 4A and B the polarity is adjusted for NMOS and PMOS so that the on direction is shown as positive for each device type.

FIG. 4A depicts exemplary waveforms representing the voltage difference between $V_{DD}$ 192 and the voltage at node 182 which result in two slew rates for the transition of the output signal from low to high, according to an embodiment of the invention. Waveform 402 represents a voltage waveform associated with the PMOS driver transistor which achieves a first slew rate at the output. Waveform 404 represents a voltage waveform which achieves a second slew rate at the output. As shown in FIG. 4A, the first slew rate is faster than the second slew rate.

FIG. 4B depicts exemplary waveforms representing the voltage at node 184 which result in two slew rates for transition of the output signal from high to low, according to an embodiment of the invention. Waveform 406 represents a waveform associated with the NMOS driver transistor which achieves a third slew rate at the output. Waveform 408 represents a voltage waveform which achieves a fourth slew rate at the output. As shown in FIG. 4B, the third slew rate is faster than the fourth slew rate.

Although FIGS. 4A and 4B depict a substantial portion of the cycle of the gate drive voltages for driver transistors 102, 104, the main components controlling the transition of the output signal are the slopes and overlaps of the gate control voltages in the region defined by voltage A (420) and voltage B (425). These are the regions where the transistor switching behavior is the most sensitive to changes in the gate control voltages. In an embodiment, voltage A is 500 mV and voltage B is 900 mV. As would be appreciated by persons of skill in the art, other voltages could be used as voltage A and voltage B, as required.

Figure 5:
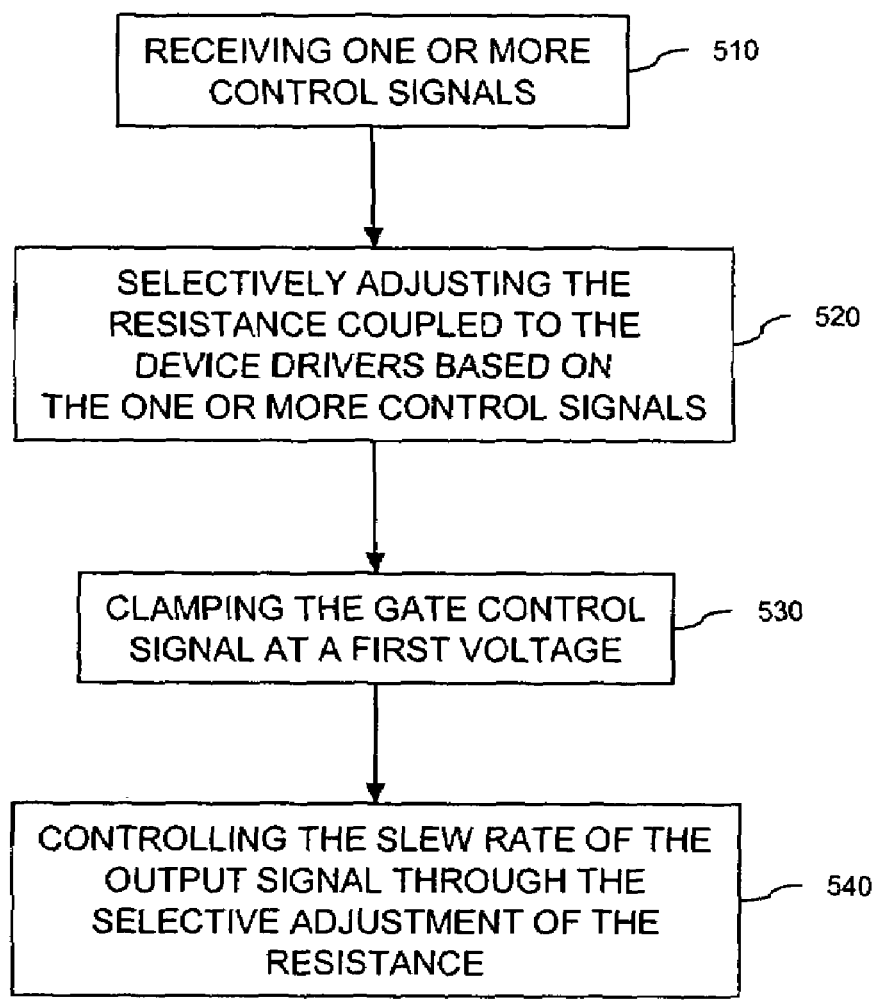
FIG. 5 depicts an exemplary flowchart of a method for controlling slew rate, according to an embodiment of the present invention.

FIG. 5 depicts an exemplary flowchart 500 of a method for slew rate control. FIG. 5 is described with continued reference to the embodiment depicted in FIG. 1. However, flowchart 500 is not limited to that embodiment.

Flowchart 500 begins at step 510 when programmable slew rate control system 5 10 receives one or more control signals 122.

In step 520, resistance is selectively adjusted based on the value of the one or more received control signals. Control signals 122 determine whether the switches in transition control blocks 120 are in an open or closed state. By selectively opening or closing one or more switches in the transition control blocks, lower or higher resistances are coupled to the gates of driver transistors 102, 104.

In step 530, the voltage of the gate control signal is clamped at a first voltage. In an embodiment, the first voltage is less than the second supply voltage. This step is optional.

In step 540, the slew rate of the output signal is controlled through selectively adjusting the resistance coupled to the gates of the driver transistors 102, 104. For example, a faster gate voltage slew rate is achieved by decreasing the value of the resistance coupled to the gates of the driver transistor. A slower gate voltage slew rate is achieved by increasing the value of the resistance coupled to the gate of the driver transistor. By proper control of the slew rates in the gate voltages and their overlap in time, the driver transistor output voltage can be made to have the desired slew rate without the extremes of causing either shoot-through current or flat periods, or other discontinuities in the output transition.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A slew rate control circuit, comprising:
   a first driver transistor coupled between a first supply voltage and a first node;
   a second driver transistor coupled between a second supply voltage and the first node;

a first programmable resistance block connected to the first supply voltage, the second supply voltage, and a gate of the first driver transistor, wherein the resistance of the first programmable resistance block is set by a first control signal; and a second programmable resistance block connected to the first supply voltage, the second supply voltage, and a gate of the second driver transistor, wherein the resistance of the second programmable resistance block is set by a second control signal, wherein a speed of a first transition of a signal at an output of the circuit from a first output voltage to a second output voltage is substantially determined by the resistance of the first programmable resistance block and a gate capacitance of the first driver transistor, wherein the first control signal and the second control signal are independent from an input signal for the first driver transistor and an input signal for the second driver transistor, and wherein a speed of a second transition of the signal at the output of the circuit from the second output voltage to the first output voltage is substantially determined by the resistance of the second programmable resistance block and a gate capacitance of the second driver transistor.

2. The slew rate control circuit of claim 1, further comprising:

a first control voltage clamp coupled between the first supply voltage and the gate of the first driver transistor; and a second control voltage clamp coupled between the second supply voltage and the gate of the second driver transistor, wherein the voltage of the gate of the first driver transistor and the voltage of the gate of the second driver transistor are confined to the regions most effective for transistor switching, whereby the voltage for each driver transistor traverses the effective switching range within an allotted cycle time determined by the data rate at a relatively slow transition rate.

3. The slew rate control circuit of claim 1, wherein the first programmable resistance block comprises:

a first resistance stage including a first switch and a first resistance coupled in series between the first supply voltage and the gate of the first driver transistor; and a second resistance stage including a second switch and a second resistance coupled in series between the gate of the first driver transistor and the second supply voltage.

4. The slew rate control circuit of claim 3, wherein the first switch and the second switch operate in a complementary manner in response to the first control signal.

5. The slew rate control circuit of claim 3, wherein the second programmable resistance block comprises:

a third resistance stage including a third switch and a third resistance coupled in series between the first supply voltage and the gate of the second driver transistor; and a fourth resistance stage including a fourth switch and a fourth resistance coupled in series between the gate of the second driver transistor and the second supply voltage.

6. The slew rate control circuit of claim 3, wherein the third switch and the fourth switch operate in a complementary manner in response to the second control signal.

7. The slew rate control circuit of claim 1, wherein the first control signal is equivalent to the second control signal.

8. The slew rate control circuit of claim 1, wherein the first driver transistor is a PMOS transistor and the second driver transistor is an NMOS transistor.

9. The slew rate control circuit of claim 1, further comprising:

an output resistance block coupled to a first node between a drain of the first driver transistor and a drain of the second driver transistor.

10. The slew rate control circuit of claim 9, wherein the output resistance block comprises:

a plurality of resistance stages coupled in parallel between the first node and an output node of the circuit, each resistance stage including a fifth switch coupled in series with a fifth resistance, wherein the resistance of the output resistance block is determined by applying a plurality of control signals to the plurality of resistance stages, one control signal per stage, to set the position of the fifth switch in each resistance stage.

11. A slew rate control circuit, comprising:

a first driver transistor coupled between a first supply voltage and a first node;

a second driver transistor coupled between a second supply voltage and the first node;

a plurality of upper transition control blocks coupled in parallel between the first supply voltage and the second supply voltage, each upper control block including a first switch coupled to the first supply voltage, a first resistance coupled to the first switch and the second node, a second resistance coupled to the first resistor and the second node, and a second switch coupled to the second resistor and the second supply voltage, wherein a resistance of the plurality of upper transition control blocks is determined by applying a control signal to set the position of the first switch and second switch in each upper transition control block, and wherein a speed of a first transition of a signal at an output of the circuit from a first output voltage to a second output voltage is substantially determined by the resistance of the plurality of upper transition control blocks and a capacitance of the first driver transistor; and a plurality of lower transition control blocks coupled in parallel between the first supply voltage and the second supply voltage, each lower control block including a third switch coupled to the first supply voltage, a third resistor coupled to the third switch and the third node, a fourth resistor coupled to the third resistor and the third node, and a fourth switch coupled to the fourth resistor and the second supply voltage, wherein a resistance of the plurality of lower transition control blocks is determined by applying a control signal to set the position of the third switch and fourth switch in each lower transition control block, and wherein a speed of a second transition of the signal at the output of the circuit from the second output voltage to the first output voltage is substantially determined by the resistance of the plurality of lower transition control blocks and a capacitance of the second driver transistor.

12. The slew rate control circuit of claim 11, further comprising:

a first voltage clamp coupled between the first supply voltage and the gate of the first driver transistor; and a second voltage clamp coupled between the second supply voltage and the gate of the second driver transistor, wherein the voltage of the gate of the first driver transistor and the voltage of the gate of the second driver transistor are confined to the regions most effective for transistor switching, whereby the voltage for each driver transistor traverses the effective switching range within an allotted cycle time determined by the data rate at a relatively slow transition rate.

13. The slew rate control circuit of claim 12, wherein the first switch and the second switch operate in a complementary manner in response to the control signal.

14. The slew rate control circuit of claim 13, wherein the third switch and the fourth switch operate in a complementary manner in response to the control signal.

15. The slew rate control circuit of claim 11, wherein the first driver transistor is a PMOS transistor and the second driver transistor is an NMOS transistor.

16. The slew rate control circuit of claim 11, further comprising:

an output resistance block coupled to a first node between a drain of the first driver transistor and a drain of the second driver transistor.

17. The slew rate control circuit of claim 16, wherein the output resistance block comprises:

a plurality of resistance stages coupled in parallel between the first node and an output node of the circuit, each resistance stage including a fifth switch coupled in series with a fifth resistance, wherein the resistance of the output resistance block is determined by applying a plurality of control signals to the plurality of resistance stages, one control signal per stage, to set the position of the fifth switch in each resistance stage.

18. A slew rate control circuit, comprising:

a first driver transistor coupled between a first supply voltage and a first node;

a second driver transistor coupled between a second supply voltage and the first node;

a first voltage clamping device coupled between the first supply voltage and a second node;

a second voltage clamping device coupled between the second supply voltage and a third node; and a transition control block, the transition control block including an upper control block coupled between the first supply voltage and the second supply voltage, the upper control block including a first switch coupled to the first supply voltage, a first resistor coupled to the first switch and the second node, a second resistor coupled to the first resistor and the second node, and a second switch coupled to the second resistor and the second supply voltage, and a lower control block coupled between the first supply voltage and the second supply voltage, the lower control block including a third switch coupled to the first supply voltage, a third resistor coupled to the third switch and the third node, a fourth resistor coupled to the third resistor and the third node, and a fourth switch coupled to the fourth resistor and the second supply voltage, wherein the first, second, third, and fourth switches receive a control signal.

19. The slew rate control circuit of claim 18, wherein the first switch and the second switch operate in a complementary manner in response to the control signal.

20. The slew rate control circuit of claim 18, wherein the third switch and the fourth switch operate in a complementary manner in response to the control signal.

* * * * *